(12) United States Patent
Hulbert

(10) Patent No.: US 8,400,151 B2
(45) Date of Patent: Mar. 19, 2013

(54) CALIBRATION METHOD

(75) Inventor: Anthony Peter Hulbert, Southampton (GB)

(73) Assignee: Siemens Aktiengesellschaft, Munich (DE)

( * ) Notice: Subject to any disclaimer, the term of this patent is extended or adjusted under 35 U.S.C. 154(b) by 523 days.

(21) Appl. No.: 12/753,150

(22) Filed: Apr. 2, 2010

(65) Prior Publication Data

US 2010/0253352 A1    Oct. 7, 2010

(30) Foreign Application Priority Data

Apr. 3, 2009   (GB) .................................. 0905771.2
Sep. 8, 2009   (GB) .................................. 0915654.8

(51) Int. Cl.
*G01V 3/00* (2006.01)

(52) U.S. Cl. ......................................... 324/309; 324/307

(58) Field of Classification Search .......... 324/300–322; 600/407–445
See application file for complete search history.

(56) References Cited

U.S. PATENT DOCUMENTS

| | | | |
|---|---|---|---|
| 3,611,110 A | 10/1971 | Corbey et al. | |
| 3,824,482 A | 7/1974 | Whelehan, Jr. | |
| 5,245,288 A | 9/1993 | Leussler | |
| 5,384,536 A | 1/1995 | Murakami et al. | |
| 6,906,520 B2 | 6/2005 | Heid et al. | |
| 6,963,770 B2 * | 11/2005 | Scarantino et al. | 600/436 |
| 6,977,502 B1 * | 12/2005 | Hertz | 324/318 |
| 7,123,009 B1 | 10/2006 | Scott | |
| 7,323,876 B2 | 1/2008 | Den Boef | |
| 7,408,349 B1 * | 8/2008 | Hertz | 324/318 |
| 7,417,433 B2 | 8/2008 | Heid et al. | |
| 7,622,928 B2 | 11/2009 | Gauss et al. | |
| 7,701,220 B2 | 4/2010 | Ehnholm | |
| 7,750,630 B2 | 7/2010 | Van Helvoort et al. | |
| 7,750,635 B2 | 7/2010 | Van Helvoort et al. | |
| 7,769,431 B2 * | 8/2010 | Scarantino et al. | 600/436 |
| 7,777,492 B2 | 8/2010 | Vernickel et al. | |
| 2003/0206019 A1 | 11/2003 | Boskamp | |
| 2007/0013376 A1 | 1/2007 | Heid et al. | |
| 2007/0188175 A1 | 8/2007 | Burdick, Jr. et al. | |
| 2007/0207763 A1 | 9/2007 | Bollenbeck et al. | |
| 2008/0157769 A1 | 7/2008 | Renz et al. | |
| 2008/0246477 A1 | 10/2008 | Nakabayashi | |
| 2009/0286478 A1 | 11/2009 | Biber et al. | |
| 2010/0261983 A1* | 10/2010 | Scarantino et al. | 600/301 |

FOREIGN PATENT DOCUMENTS

GB     1132545     1/1967

OTHER PUBLICATIONS

U.S. Appl. No. 12/874,706, filed Sep. 2, 2010.
U.S. Appl. No. 12/726,567, filed Mar. 18, 2010.
U.S. Appl. No. 12/753,159, filed Apr. 2, 2010.
U.S. Appl. No. 12/753,132, filed Apr. 2, 2010.
U.S. Appl. No. 12/753,134, filed Apr. 2, 2010.

(Continued)

*Primary Examiner* — Brig Shrivastav
(74) *Attorney, Agent, or Firm* — Schiff Hardin LLP

(57) ABSTRACT

A method for calibration of a magnetic resonance imaging system having a bore, a body coil mounted in the bore, a patient mat, a number of local coils mounted in the patient mat, an upconversion stage having a number of upconverters, and a processing stage, includes the steps of generating a calibration signal in the body coil; receiving the calibration signal at the local coils, upconverting the signal from the local coils in the upconversion stage, transmitting the upconverted signal to the processing stage, synchronously downconverting the signal in the processing stage using the calibration signal generated in the body coil, and processing the downconverted signal to generate an overall path complex gain.

36 Claims, 5 Drawing Sheets

OTHER PUBLICATIONS

U.S. Appl. No. 12/753,148, filed Apr. 2, 2010.
U.S. Appl. No. 12/753,138, filed Apr. 2, 2010.

"Behavioral Modeling and Simulation of a Parametric Power Amplifier," Gray et al., IMS (2009) pp. 1373-1376.

* cited by examiner

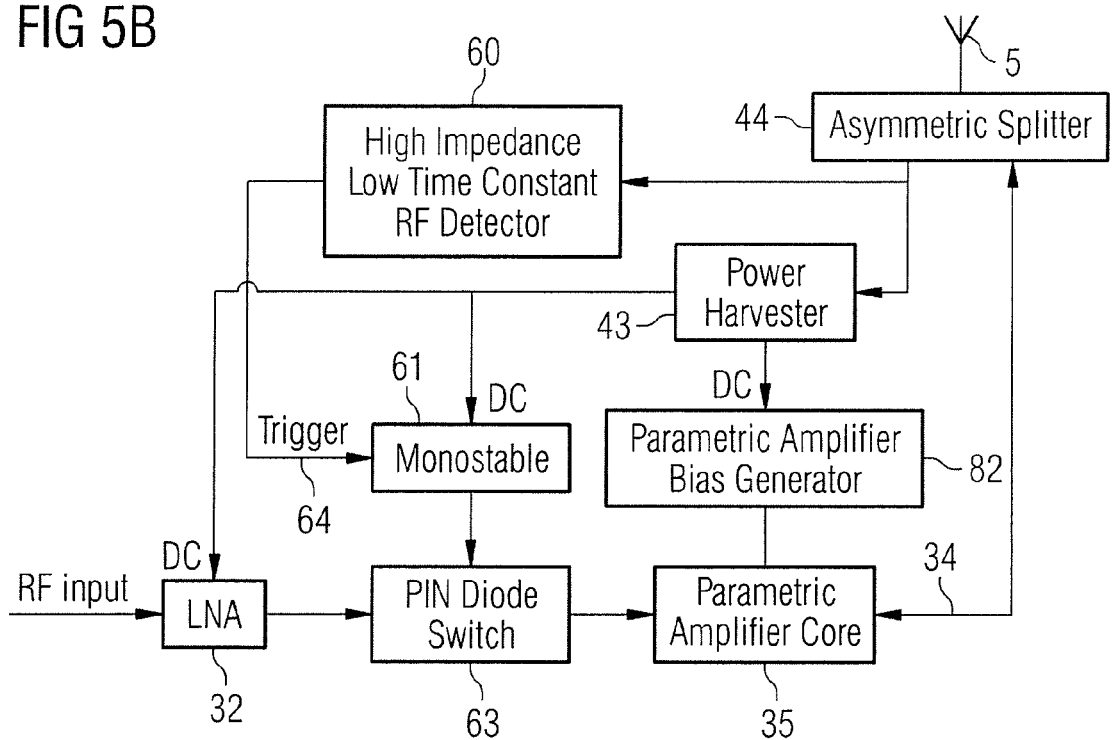
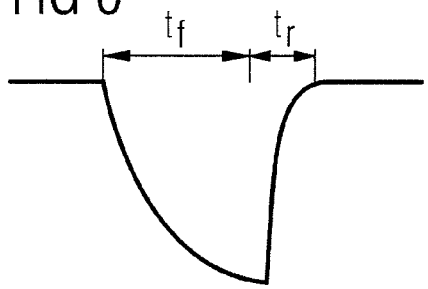
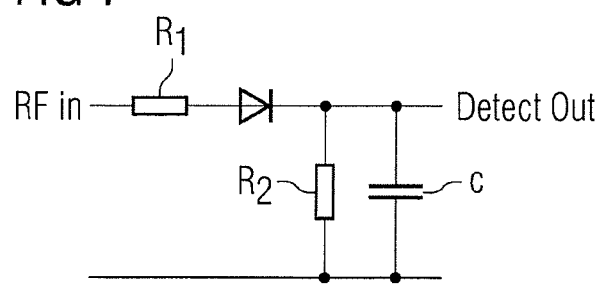

CALIBRATION METHOD

BACKGROUND OF THE INVENTION

1. Field of the Invention

The present invention relates to a method of calibration of a magnetic resonance imaging (MRI) system and a motion compensation circuit, in particular for compensating for the effects of motion of an image subject during MRI scanning using phase encoding in a magnetic resonance imaging system.

2. Description of the Prior Art

MRI scanners use a combination of a strong constant magnetic field ($B_0$) from a superconducting magnet which is modified by gradient fields generated by gradient coils, together with a rotating magnetic field ($B_1$) from a radio frequency (RF) antenna to excite nuclear magnetic resonances in the body that generate short term RF signals that are received to build up a tomographic image.

All current-generation MRI scanners employ arrays of local coils mounted in close proximity to the scanned patient to receive the RF with maximum possible signal to noise ratio (SNR). The local coils that receive signals from the back of the patient are mounted in the patient table. Local coils that receive signals from the front of the patient are arranged into 'mats' that are carefully placed over the part of the patient for imaging. Associated with each mat is a flexible cable typically containing one co-axial line for each local coil. The cables interact with the $B_1$ field and with the signals generated from the patient so 'traps' (high impedance sections) must be included at regular (typically $\lambda/8$) intervals. These add cost and inconvenience to the structure. In use, the requirement to connect the cables and sterilize them between scanning one patient and the next leads to down-time between scans. A wireless implementation allows elimination of these cables. However, in a wireless implementation, there may be errors introduced into the received signals due to motion of the patient.

SUMMARY OF THE INVENTION

In accordance with a first aspect of the present invention, a method is provided for calibration of a magnetic resonance imaging system having a bore, a body coil mounted in the bore, a patient mat, a number of local coils mounted in the patient mat, an upconversion stage comprising a number of upconverters, and a processing stage. The method includes generating a calibration signal in the body coil, receiving the calibration signal at the local coils, upconverting the signal from the local coils in the upconversion stage, transmitting the upconverted signal to the processing stage; synchronously downconverting the signal in the processing stage, using the calibration signal generated in the body coil, and processing the downconverted signal to generate an overall path complex gain.

The present invention provides a method of compensating for the effects of motion of an image subject during magnetic resonance imaging.

Preferably, the upconverter has a parametric amplifier.

Alternatively, the upconverter has a mixer.

Preferably, the upconverter further has a low noise amplifier.

Preferably, separate activation of each of the multiple upconverters is provided, such that signals from each of the upconverters are individually resolvable, whereby individual upconverter path gains are generated in the processing stage.

Preferably, the upconverters are activated by an activation waveform, in accordance with an activation function.

Generally, the activation function is chosen to be a step function, although it is not limited to this.

Prior to generation of the calibration signal, the upconverters are in an abnormal mode of operation, as defined hereafter, but preferably activation comprises triggering a change of mode of the upconverters from an abnormal mode to a normal mode.

Preferably, generation of the calibration signal is terminated after activation of the last of the plurality of upconverters.

Preferably, an estimate of a plurality of path gains over paths from a plurality of local coils to a receiver is derived from a received signal and a signal response function corresponding to each of the local coils.

Preferably, signal response functions are arranged as rows or columns of a matrix.

This matrix is referred to herein as a constructor matrix.

Preferably, the signal response function corresponding to a local coil is a time sampled convolution of the activation function including a time offset corresponding to an activation time of the local coil corresponding to that local coil, a bandlimiting function associated with a radio channel; and a complex baseband representation of a signal calibration waveform.

Preferably, an estimate is derived for each of a number of receivers.

Preferably, estimates of path gains from a local coil to a receiver are formed by multiplying a vector of the time sampled signal received from the receiver by a pseudo-inverse of a constructor matrix.

Preferably, the calibration signal is applied for a time period, after all upconverters have changed mode, sufficient that behavior of the upconverters in normal mode can stabilize before removing the calibration signal.

Preferably, a composite response of the upconverters to removal of the calibration signal is measured.

Although the activation waveform could be a rectangular pulse, preferably the activation waveform is a simple delay pulse.

Preferably, the separate activation is sequential.

Although the sequential activation may be achieved by the first upconverter having a self start function and all subsequent upconverters being triggered by the preceding one after a fixed delay, preferably each upconverter is self starting and activated independently of the activation of any other.

Preferably, the separate activation is adapted such that, within a tolerance of operation of components in the upconverter stage, a minimum time gap is maintained between activation of each succeeding upconverter.

Preferably, a partial geometric growth element is added to an assigned time of activation to provide a separation greater than or equal to the reciprocal of the receiving bandwidth between switching times.

Preferably, the activation time of each upconverter is measured.

Preferably, separate activation is enabled by one of a PIN switch, a varactor diode bias, or a low noise amplifier output switch.

Preferably, the calibration signal comprises a single carrier outside the magnetic resonance signal bandwidth.

Preferably, a single carrier calibration signal centered on the magnetic resonance signal bandwidth is transmitted prior to a magnetic resonance imaging sequence to determine signal arrival delays.

Alternatively, the calibration signal has a pair of carriers whose frequencies are disposed symmetrically about the magnetic resonance signal frequency band.

Preferably, the pair of carrier signals includes the output of a first oscillator operating at a nominal center of the magnetic resonance signal bandwidth multiplied by the output of a second oscillator at a frequency of one half of the desired separation in frequency of the two carriers.

Preferably, a phase of the first oscillator is reset to the same value at the same point in the calibration sequence for every measurement cycle.

Preferably, the system comprises a number of patient mats.

Preferably, upconverters of each patient mat are activated with non-overlapping activation delays.

Preferably, the activation delays are interleaved for each mat.

Preferably, activation of upconverters within any of the mats is limited by a field of view.

Preferably, actual upconverter activation delay is measured for upconverters within the field of view.

Preferably, super-resolution based on an incremental multi-parameter algorithm is applied.

In accordance with a second aspect of the present invention, a motion compensation circuit is provided for a magnetic resonance imaging system a bore, a body coil mounted in the bore, a patient mat, a number of local coils mounted in the patient mat, an upconversion stage has a number of upconverters, and a processing stage. The motion compensation circuit has a calibration signal generator that generates a calibration signal in the body coil, receives the calibration signal at the local coils, upconverts the signal from the local coils in the upconversion stage, transmits the upconverted signal to the processing stage, synchronously downconverts the signal in the processing stage, using the calibration signal generated in the body coil, and processes the downconverted signal to generate an overall path complex gain.

Preferably, the circuit further has a first oscillator at the nominal center frequency of the magnetic resonance signal bandwidth and a second oscillator at a frequency of half the desired frequency separation between two calibration signal carriers.

Preferably, the circuit further has a Wiener estimator in the processing stage for each upconverter.

Preferably, the system has a number of patient mats.

BRIEF DESCRIPTION OF THE DRAWINGS

FIG. 5B illustrates another example of an upconversion stage for the method and apparatus of the present invention, for use in the system of FIG. 1.

FIG. 6 illustrates a trigger waveform used in the upconversion stage of FIGS. 5A and 5B.

FIG. 7 illustrates an example of a detector circuit for use in the upconversion stage of FIGS. 5A and 5B.

DESCRIPTION OF THE PREFERRED EMBODIMENTS

The wireless concept to which the features of the present invention apply is based on upconversion, in the patient mat, of the RF (Larmor) frequency signals from the patient coils to microwave frequencies for transmission to microwave antennas located on the bore of the scanner. The combination of transmit and receive antennas on the patient and bore respectively constitutes a MIMO (Multiple Input/Multiple Output) system. The greater multiplicity of receive antennas in the bore array allows individual signals from a plurality of patient antennas to be resolved. The present invention relates to an implementation of the upconversion process to provide calibration and motion compensation.

Figure 1:
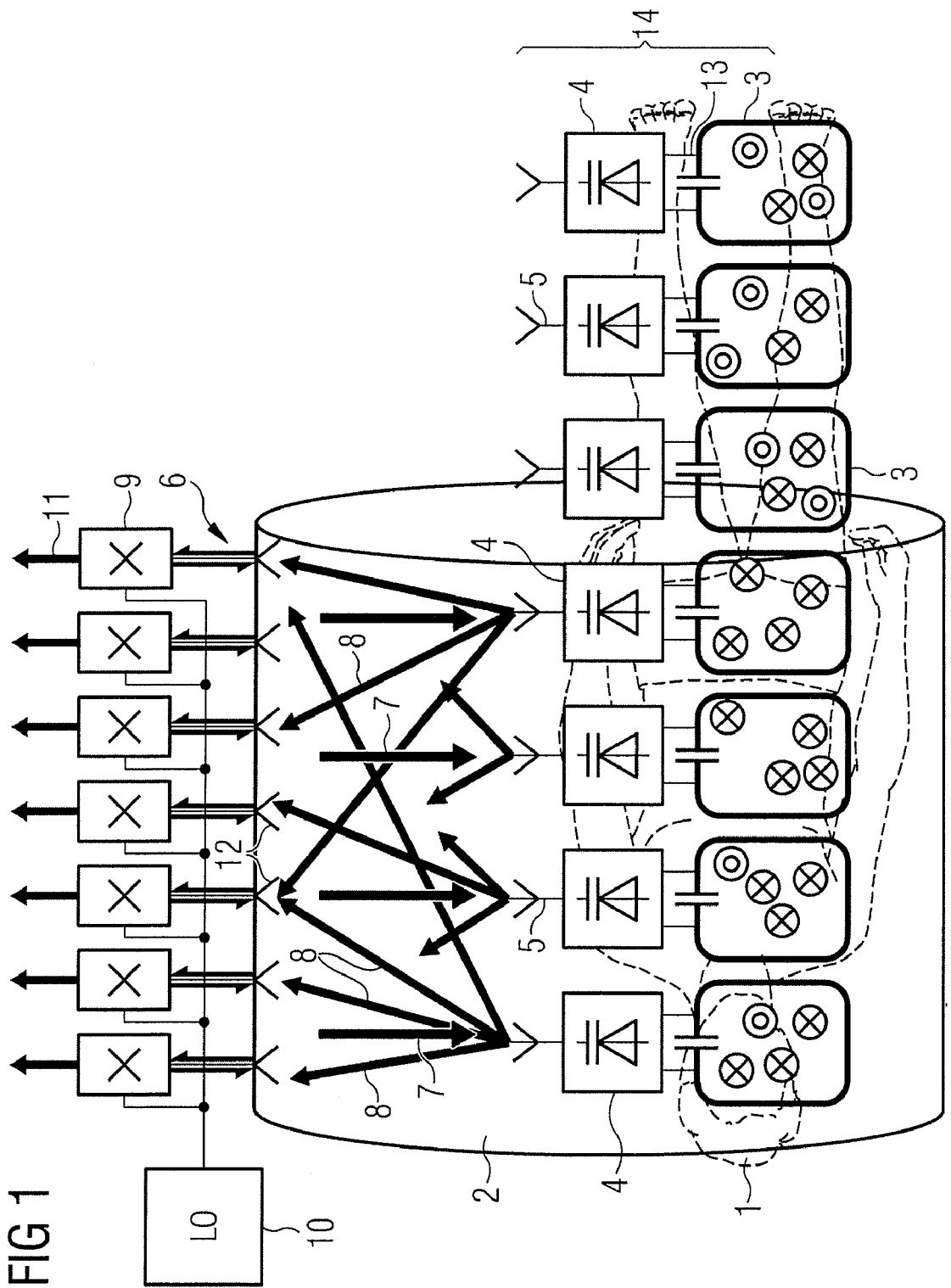
FIG. 1 illustrates an example of an MRI system suitable for carrying out the method according to the present invention.

An example of an MRI system using a MIMO microwave link, in which amplifiers in accordance with the present invention are used, will now be described. FIG. 1 shows a patient 1 within an MRI scanner bore tube 2. A mat covers the part of the patient to be imaged and embedded in the mat are a number of local coils 3. Associated with each local coil 3 is an upconverter stage 4 and microwave antenna 5. Transceivers 9, connected to an array 6 of antennas 12, are integrated into the scanner bore 2. The frequency upconverter 4 for each patient mat coil 3 produces signals for transmission to the array of transceivers in the scanner bore 2. The upconverter may have a parametric amplifier or a mixer, in each case, with or without an additional low noise amplifier at the input. A local oscillator (LO) signal at around 2.4 GHz, or other chosen microwave frequency, feeds the antenna array 6 to illuminate the patient coil electronics 14 with a signal 7 at the local oscillator frequency.

Figure 2:
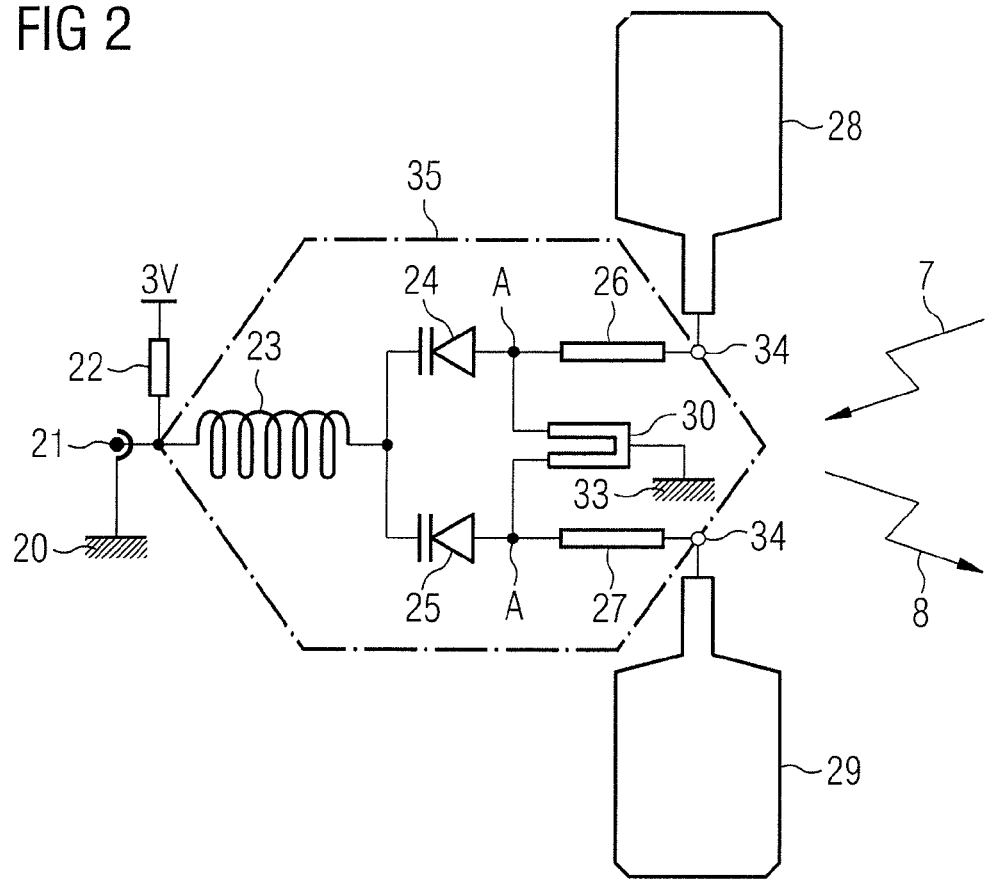
FIG. 2 illustrates in more detail, an example of an upconverter for use in the system of FIG. 1.

In the examples described with respect to FIG. 2, the upconverters include parametric amplifiers in the upconverter stage 4 which use the incident local oscillator signal 7 to provide a frequency reference and power for upconversion. Magnetic resonance (MR) signals 13 from the coils are thereby converted to microwave frequency signal 8 and transmitted to the bore transceiver antenna array 6. The same local oscillator signal in the transceivers converts the upconverted signals 8, from the patient coils 3, at the LO frequency±63 MHz, back to the original MR frequency of 63 MHz for input 11 to MR receivers in an image processing system (not shown.) The Larmor frequency $\omega_0$ is dependent upon the gyromagnetic ratio $\gamma$ and the magnetic field strength $B_0$, so in the case of a 1.5 Tesla magnet, the MR frequency is 63.6 MHz, or for a 3 T magnet, the MR frequency is 123 MHz. These values are commonly used magnet and MR frequencies, but magnets ranging from 0.5 T to 11 T could be used and the MR and local oscillator microwave frequencies may also be chosen from a much wider band. For example, dependent upon the nucleus type, the MR frequencies may range from 20 MHz to 500 MHz and the LO frequency might be chosen in the range of 1 GHz to 5 GHz.

The system of this example uses a parametric amplifier circuit to carry out the mixing and amplification necessary for upconversion 4 of a radio frequency signal 13 received from each of the local coils 3.

An example of the parametric amplifier is shown in more detail in FIG. 2. The example of FIG. 2 comprises a parametric amplifier core having a single ended RF input 21 to receive the signal 13 from the local coil and an earth 20 at the input and an output port 34 for connection to a dipole antenna 28, 29. In this example, the magnetic resonance signal is at 63.6 MHz. The RF signal 13 is fed via a high Q RF input inductor 23 to drive the varactor diode pair 24, 25 in common mode parallel with 'earth return' via the shunt matching line pair 30 to ground connection 33. A high impedance (very low current requirement) voltage source provides bias voltage 22 at e.g. 3V via the high Q RF input matching choke 23 to the varactor diode pair 24, 25 (e.g. BBY53-02V) to set the correct operational capacitance bias point. Incident local oscillator 'pump' signal 7 (at a frequency for example of 2.44 GHz) received by the microwave antenna 28, 29 is fed via the appropriate printed microwave series matching lines 26, 27 and shunt matching lines 30 to provide differential drive (with center ground 33) to the varactor diode pair 24, 25. This differential LO signal 7 mixes with the common mode RF drive signal 13 in the varactor diodes 24, 25 to produce microwave frequency lower side band (LSB) and upper side band (USB) products. These differential mode mixing products are fed back through the microwave matching lines 26, 27 to the microwave antenna 28, 29 for transmission back to the bore array of transceivers.

The two varactor diodes 24, 25 of the parametric amplifier circuit serve as an upconverter and an amplifier that requires no DC power supply, using directly the 'pump' signal 7 as a local oscillator and source of power. Parametric amplifiers are typically two port devices where a first port receives an input signal at a relatively low frequency to be upconverted and amplified and a second port both receives the pump signal at a relatively high frequency and outputs the relatively high frequency upconverted and amplified mixing product. Circulators are commonly used to separate the upconverted output signals from the incident LO drive signals, but these ferromagnetic based devices are not suitable for MRI applications because of the B0 field. Instead, re-radiated LSB/USB signals are separated from the incident LO in filters in the bore transceivers.

For the example, it is desirable that the pump signal 7 to the parametric amplifier should be received from an over-the-air transmission in order to remove any requirement for a DC power supply to the mat. The total bandwidth occupied by the upper and lower sidebands 8 and the pump signal 7 is typically small enough to fall within the efficient bandwidth of a single antenna. Thus, a two port parametric amplifier circuit, is provided such that the first port 21 receives the input signal 13 to be upconverted and amplified and the second port 34 receives the pump signal 7 and also outputs the upconverted and amplified input signal 32 at the upper and lower sideband frequencies.

The local oscillator signal 7 received by the dipole antenna 28, 29 from the bore array transmitters 9 arrives at the microwave port 34 at a power level of +10 dBm. This "pump" signal is fed via the printed line matching 26, 27 to the varactor diode pair 24, 25. The common cathode configuration of the varactor diodes, with the anodes connected one to each half of the balanced feed from the dipole antenna 28, 29, results in antiphase stimulation of the varactor diodes at the LO (pump) frequency. RF stimulation via the RF input inductor 23 at the common cathode node leads to in-phase stimulation of the varactor diodes 24, 25 at the RF frequency. The resulting LSB and USB signals generated in each of the two varactor diodes are therefore in anti-phase. These wanted output signals, along with the greater (reflected) part of the incident LO signal 7, are then conveyed via the printed line matching 26, 27 back to the dipole antenna 28, 29 where the signals 8 are broadcast into the bore 2 for reception by the bore receiver array system 6, 9, 10.

The high Q RF input matching choke 23 in series with the single ended RF input 21 is series resonant with the high capacitive reactance of the varactor diodes 24, 25 at the RF frequency. The earth return for the RF feed 21 is provided by the center grounding 33 of the microwave port shunt line. The center-grounded shunt microstrip line in the microwave port 34 resonates with the greater part of the high capacitive admittance of the varactor diodes 24, 25 at the microwave port frequency. The balanced pair of series lines 26, 27 then tunes out the remainder of the capacitive reactance of the varactor diodes and completes the impedance transformation to match to the 22Ω balanced load of the microwave dipole antenna 28, 29.

In this implementation, the diodes are connected in parallel for the RF feed, to halve the high impedance of the varactor diodes at 63.6 MHz RF for presentation at the RF port. The diodes are connected in series for the microwave port to double the very low impedance of the varactor diodes at 2.442 GHz for presentation at the microwave port. The series/parallel configuration lends itself to single ended RF drive, balanced microwave drive and two port operation. A single ended RF drive is appropriate at 63.6 MHz and is effected by means of drive through the RF input choke 23 and ground return 33 at the microwave port voltage node. A balanced microwave port is appropriate at 2.44 GHz for connection to a dipole antenna.

The microwave port operates fully balanced for LO "pump" feed at 2.442 GHz as well as for the output frequencies at 2.442 GHz±63.6 MHz. This obviates the need for any low impedance grounding in the microwave port circuits. Operation of the microwave port fully balanced suits perfectly connection to the balanced dipole antenna 28, 29 for reception of the LO signal 7 and re-radiation of the LSB and USB signals 32.

The design of this implementation is configured to allow high, in fact potentially infinite, "4-frequency" gain. This is a re-generative condition whereby RF frequency power that is produced in the generation of the LSB signal cancels with incident RF from the signal source to result in a reduced level of absorbed RF power for a given output and hence an increased gain. The correct power balance to achieve a controlled fixed gain is dependent on the precise tuning of the microwave port 34, which in turn is dependent on the bias voltage applied to the varactor diodes 24, 25, so uses a system for precise control of the bias voltage to achieve this control, and in addition to compensate for the dependence of the microwave port tuning on LO drive level In summary, local coil upconverters based on parametric amplifiers perform the upconversion of the local coil signals from the Larmor frequency to microwave frequencies, implementing low noise frequency conversion and amplification in simple, low cost circuitry. The parametric amplifiers use the incident local oscillator signal 7 to provide the frequency reference and the power for the upconversion. MR signals 13 from the coils are thereby converted to microwave frequency and transmitted to the bore transceiver antenna array 6.

The wireless coils concept involves upconverting the Larmor frequency MR signal received on the local coils to a much higher frequency in the 2.4 GHz band. The upconverted signal is transmitted across a short radio path to an array of receive antennas and receivers that line the bore. Movement of the patient during a scan will vary the length of the radio paths, resulting in changes in amplitude and phase. The local oscillator frequency is much higher than the Larmor frequency, (typically about 40 times for a 1.5 T scanner), so the effect of the movement on phase is greatly magnified. For example, at 2.45 GHz, a 5 mm change in path length corresponds to a phase shift of 15°. However, the effect is greater than this, because the upconversion is performed using a local oscillator that has been transmitted from the bore antennas to the patient. Thus, the change in path length will also alter the local oscillator path. The combined effect is therefore to double the impact of patient movement—thus a 5 mm change in path length will correspond to a phase shift of 30°.

The present invention provides a method of calibration of an MRI system that compensates for the effects of motion of an image subject during magnetic resonance imaging and a circuit for carrying out the motion compensation. In the method there are stages of regularly measuring the matrix of path gains between the local coils and the bore receivers and regularly dividing the matrix of received signals by the matrix of path gains, so as to remove the effects of path gain changes. Separate activation of each of the plurality of upconverters is required in order that the signal from each upconverter is individually resolvable to generate individual upconverter path gains, hence the upconverters are activated by an activation waveform in accordance with an activation function, typically a step function.

The method of measuring the path gains may include the steps of starting to transmit a calibration signal at or near to the Larmor frequency from the body coil 70 with the parametric amplifiers 35 arranged to be in an abnormal mode of operation at this time. The calibration signal is received at the local coils 3 and upconverted in the upconversion stage 4. The upconverted signal is transmitted to the processing stage, where the calibration signal is used to synchronously downconvert the transmitted signal, which can be processed to generate an overall path complex gain. The parametric amplifiers are arranged to enter their normal mode of operation sequentially to generate a 'staircase' of signal step functions as each signal level is switched to its normal state. Each of the bore receivers receives the staircase of signals and uses the received signal in conjunction with knowledge of the signal activation times and of the signal band limiting function to estimate the path gains from each of the local coils to itself. After the last parametric amplifier has activated the calibration signal is switched off.

Sequential separate activation of the upconverters may be achieved with self-starting upconverters which are activated independently of one another. The separate activation is adapted such that, within a tolerance of operation of components in the upconverter stage, a minimum time gap is maintained between activation of each succeeding upconverter. To further ensure separation of the received signals, a plurality of patient mats may be used. A field of view may be defined, covering only part of one of the mats and the upconverters operated in such a way that only those which fall within the field of view are activated at any time. To ensure that different mats do not give rise to concurrent activation of their upconverters, the activation delays may be arranged to be non-overlapping, or interleaved for each mat.

Figure 3:
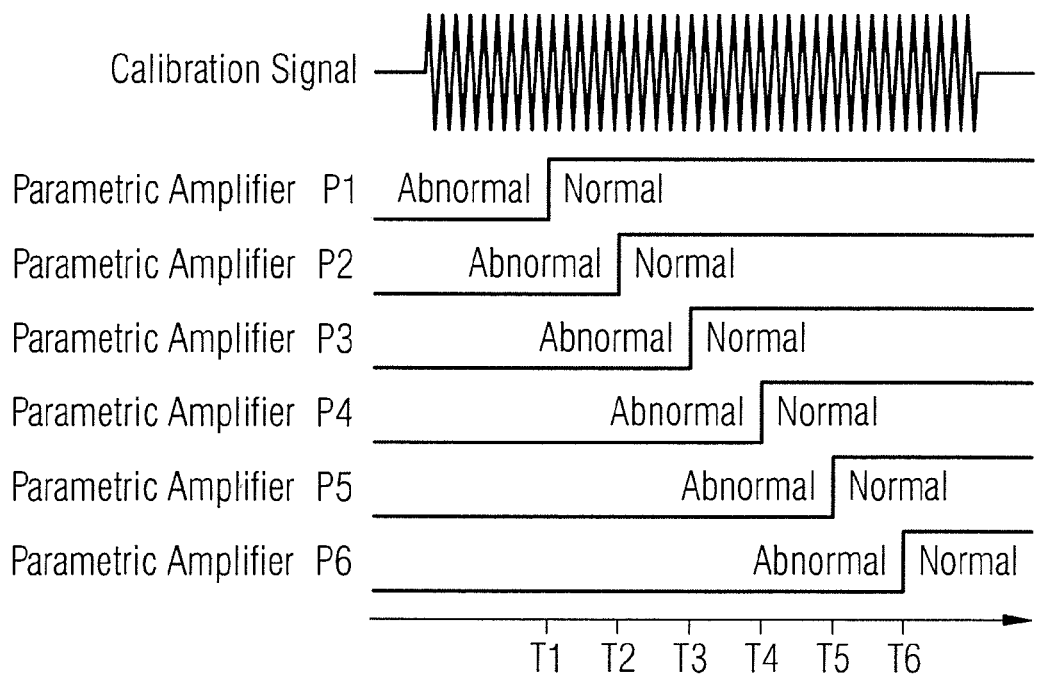
FIG. 3 shows a calibration sequence for operating each parametric amplifier in the upconverter of FIG. 2.

Abnormal operation may be defined as any of: off, substantially off (i.e. operating with very low gain) or operating with complex gain that is substantially different from its complex gain when in normal operation. An example of the latter case would be where the phase of the complex gain in abnormal mode is near to 180° different from the complex gain in normal mode. In this case the magnitudes of the gains in the two modes could be very similar. In fact this case represents the maximum, and therefore optimum, possible change in complex gain between the two modes, assuming that the magnitude of the gain in the abnormal mode is not increased above the magnitude of the gain in the normal mode. For a number of upconverter stages 4, each with a separate parametric amplifier 35, as shown in FIGS. 1 and 2, a possible sequence of activations is shown in FIG. 3. Although the detailed examples relate to the use of parametric amplifiers as upconverters, an alternative is to use mixers. In either case, there is an option of putting a low noise amplifier before the upconverter in the upconversion stage.

A calibration signal 40, in this example represented as a single carrier wave, is generated by the body coil 70. Alternative waveforms are possible, as will be described later. All of the parametric amplifiers are initially operating in an abnormal mode. An activation waveform is provided for each parametric amplifier P1, P2, P3, P4, P5, P6 respectively. After a delay of time, t the activation waveform for amplifier P1 switches 51 at time T1 and causes amplifier P1 to enter normal mode of operation. Amplifiers P2 to P6 continue to operate in abnormal mode. At time T2, the activation waveform cause amplifier P2 to switch 52 to normal mode, whilst P3 to P6 continue in abnormal mode. This continues at times T3, T4, T5, T6 for amplifiers P3, P4, P5, P6 switching 53, 54, 55, 56 until all six amplifiers have been activated by switching to normal mode. After the final amplifier P6 has been switched, the calibration signal is switched off. A delay may be applied, in order that all of the amplifiers have settled down to operate in normal mode before the calibration signal is switched off.

Figure 4:
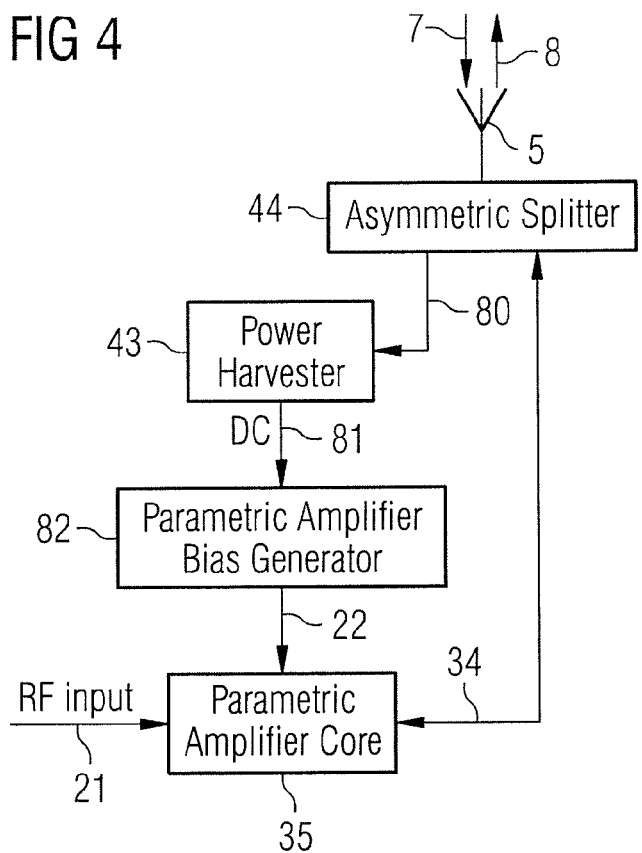
FIG. 4 illustrates an upconversion stage, including splitter and power harvester, for use in the system of FIG. 1.

One method of triggering the parametric amplifiers into the abnormal mode is to introduce a temporary gap in the transmission of the local oscillator. A modification of the parametric amplifier architecture of FIG. 2 may be required and an example of this is illustrated in FIG. 5. For comparison, an upconversion circuit without the trigger is illustrated in FIG. 4. The parametric amplifier core 35 requires a DC bias 22 to be applied to its varactor diodes 24, 25. In the example shown in FIG. 4, this bias is obtained by extracting some of the power from the local oscillator signal 7 with an asymmetric splitter 44 to a power harvesting circuit 43. For example, the asymmetric splitter might divert 10% of the local oscillator power to the power harvester whilst passing the remaining 90% to the parametric amplifier core. The power harvester 43 rectifies its incident RF 80 with suitable voltage multiplication to obtain the required DC voltage 81. The power harvesting circuitry contains at least one reservoir capacitor to average the received energy over variations. A time constant is associated with the reservoir capacitor and its load. The DC voltage 81 provided by the power harvester is fed to a parametric amplifier bias generator 82. This typically provides a regulated DC voltage 22 of magnitude suitable for correct biasing and operation of the parametric amplifier core.

This arrangement addresses the problem of variation of incident local oscillator power by introducing the regulator 82 between the rectifier 43 and the DC bias input 22 of the parametric amplifier 35. This removes the direct dependency of the DC bias on the local oscillator strength. An additional feature is to add a controlled dependency of DC bias 22 to the voltage 81 at the input to the regulator. This controlled dependency may include a defined non-linear relationship between these voltages. The local oscillator signal 7 is received at a microwave antenna 5. The same antenna returns an upconverted signal 8 to the bore antennas. The power splitter 44, such as a Wilkinson splitter, or directional coupler to split the incident LO signal power in a desired ratio between a single port input/output 34 of the parametric amplifier core 35 and the DC voltage generator 43 is optional. The power splitter 44 may be of the type described in co-pending UK patent application 2009P05909 (corresponding to U.S. application Ser. No. 12/726,567 filed simultaneously herewith), with the benefit that the power available is not influenced by the varying LO power. The power harvester 43 may incorporate a resonant voltage transformation circuit and/or a Cockcroft-Walton voltage multiplier as necessary to obtain the required output voltage. The parametric amplifier bias generator 82 is interposed between the power harvester DC output and the bias voltage input of the parametric amplifier core 35.

Figure 5A:
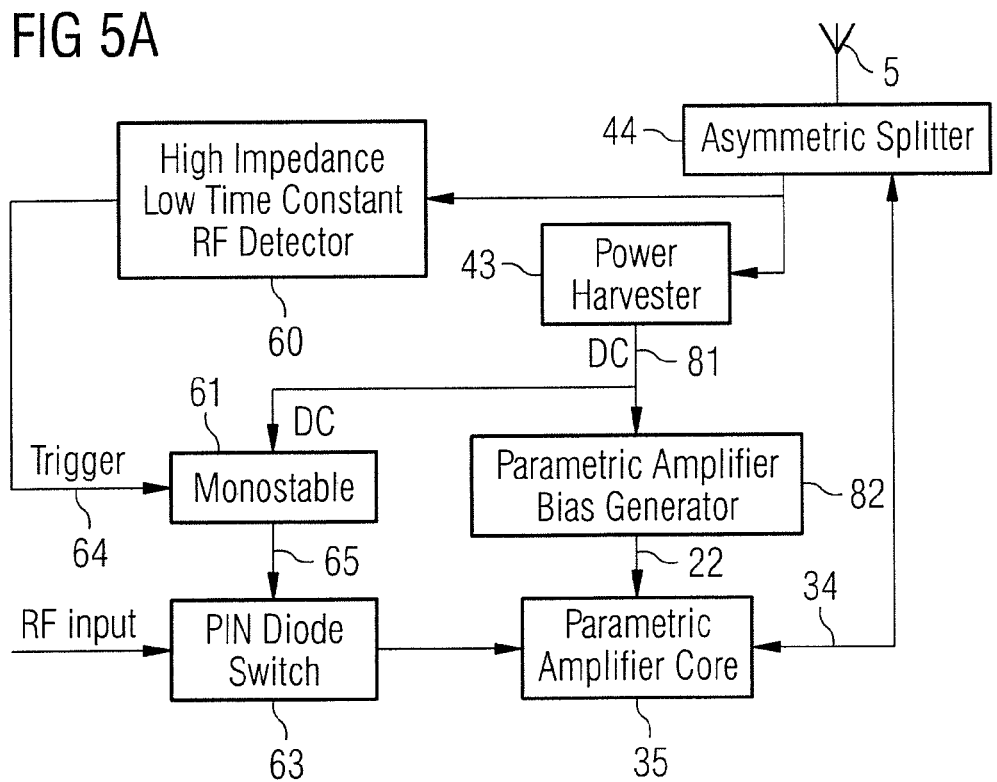
FIG. 5A illustrates one example of an upconversion stage for the method and apparatus according to the present invention, for use in the system of FIG. 1.

FIG. 5A illustrates one embodiment of the invention with the upconverter stage 4 modified to provide a trigger 64. A high impedance, low time constant, RF detector 60 and a power harvester 43 are connected to the lower power output of the asymmetric splitter 44. Because of its high input impedance, the detector 60 only loads this output to a small degree relative to the load presented by the power harvester 43. The detector 60 produces a voltage that responds rapidly to changes in the local oscillator level. A brief removal of the local oscillator signal 7 produces a trigger waveform similar to that shown in FIG. 6 at the output of the detector 60. This waveform shows typical behavior for such a detector in that the falling edge time constant, $t_f$ is longer than the rising edge time constant, $t_r$. This reflects typical values for components in such a detector circuit, for example as shown in FIG. 7. The decay time constant (falling edge) is $R_2C$, whereas the attack (rising edge) time constant is $R_cC$, where $R_c$ is the parallel combination of $R_1$ and $R_2$. In order to avoid significant detector attenuation from the potential divider of $R_1$ and $R_2$, typically $R_1 \ll R_2$ in such a circuit, so that $R_cC \ll R_2C$. It is therefore preferred to use the rising edge of the waveform.

In order for the proposed system to work, the power harvester time constant must be large enough to ensure acceptable, generally negligible, harvested DC voltage droop during the brief period in which the local oscillator 7 is removed. This characteristic allows the power harvester 43, in addition to providing DC bias 22 to the parametric amplifier 35 to power a low power, e.g. CMOS, monostable 61. This monostable 61 is typically triggered 64 by the rising edge 62 of the RF detector 60. The modified parametric amplifier circuit is arranged such that while the monostable is in its triggered state, the parametric amplifier 35 is in its abnormal state. In the implementation shown in FIG. 5A, the monostable output 65 provides current to a PIN diode switch 63 at the input of the parametric amplifier. This may be arranged in one of two ways. If the PIN diode operates as a series switch, then triggering the monostable serves to switch the DC current into the PIN diode, off. Alternatively, if the PIN diode operates as a shunt switch then triggering the monostable serves to switch the DC current into the PIN diode on. Although the first configuration is not precluded, the second of these is preferred for two reasons. Firstly, the parametric amplifiers operate in abnormal mode for only a brief period whereas they operate in normal mode for up to the remainder of the time. Thus, it is easier to harvest enough energy over the longer period to provide PIN current over the shorter period, rather than vice versa. The second reason is that it should be possible to achieve lower losses in the on (normal) state with the shunt switch, than with the series switch. There may also be benefits in incorporating a low noise amplifier 32 at the input to the parametric amplifier and driven by DC power from the power harvester 43 as illustrated in FIG. 5B.

Figure 8:
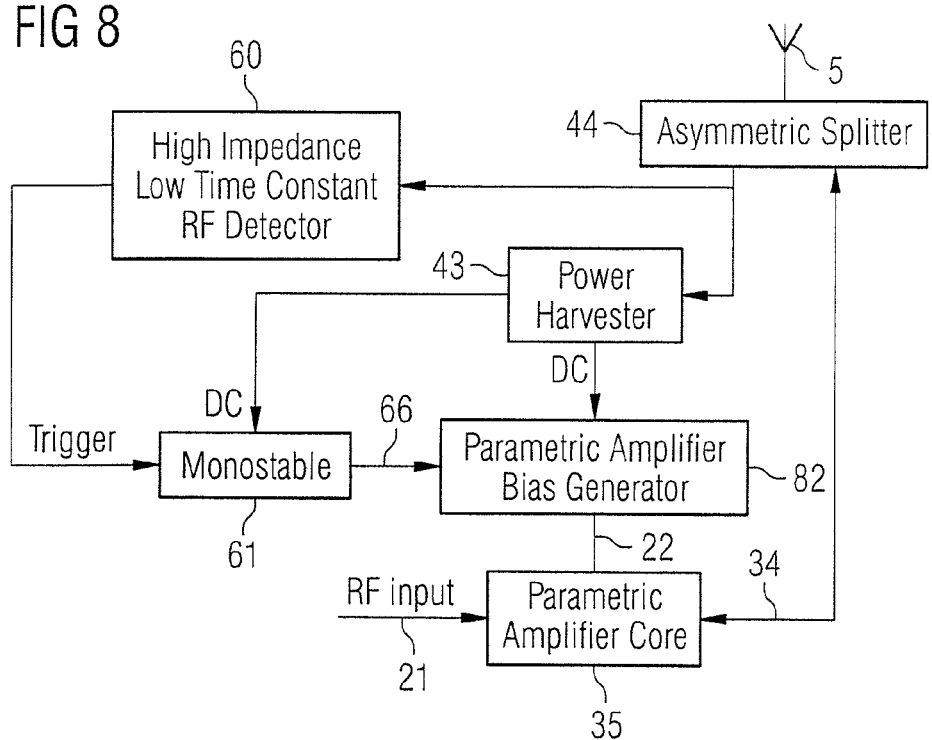
FIG. 8 shows an alternative example of an upconversion stage for the method and apparatus of the present invention, for use in the system of FIG. 1.

An alternative configuration is shown in FIG. 8, in which the parametric amplifier is switched into abnormal mode by arranging for the output of the monostable 61 to provide an offset bias 66 by introducing a temporary shift in the bias voltage 22 for the parametric amplifier core 35. This has the advantage of requiring less power than the option of FIG. 5. However, the bias arrangement in the parametric amplifier necessarily includes a decoupling capacitor to separate the DC from the RF. This leads to a time constant that may limit the speed of switching between the two normal and abnormal modes of operation using this technique.

In order to obtain the calibration sequence of FIG. 3, the delay periods must be different for all the parametric amplifiers. In the case of the monostable implementation this means that the resistor and/or capacitor that set the monostable periods must be different. If the receiving bandwidth is equal to B, then for practical separation of the different received signals the mode switching points must all be separated for the different parametric amplifiers by at least 1/B. For example, if the bandwidth, B=1 MHz, then the mode switching points must be separated by a minimum of 1 µs. However, real capacitors and resistors will have tolerances, e.g. ±5%. For the later mode switching points these tolerances can amount to significant changes in absolute switching point time. Thus, the effect of component tolerances could be that parametric amplifiers X and Y that are intended to switch modes in the order X followed by Y, where the switching times are separated by 1/B, may switch modes at times separated by less than 1/B, at the same time, or even in the opposite order. Accordingly, another aspect of this invention is to assign nominal mode switching times that have a partial geometric growth element to ensure that worst case tolerances can never, or only extremely rarely, result in any two parametric amplifiers' modes switching times being separated by less than 1/B. An example of how to achieve this is given below, where T is the minimum separation between parametric amplifier mode switching times; p is the number of parametric amplifiers; n is the index of parametric amplifiers $n \in \{1:p\}$; $t_{earliest}(n)$ is the earliest allowable mode switching time for the nth parametric amplifier; $t_{nominal}(n)$ is the nominal mode switching time for the nth parametric amplifier; $t_{latest}(n)$ is the latest possible mode switching time for the nth parametric amplifier; and Tol is the common fractional tolerance in the set time for each parametric amplifier.

The first mode switching time needs to be separated from the calibration signal activation time in order to be able to null any response to the calibration signal activation. The minimum initial delay is $T_{initial}$. In order to guarantee to have a minimum of this initial delay we set $t_{earliest}(1)=T_{initial}$. Starting with $t_{earliest}(1)=t_{nominal}(1)=t_{latest}(1)$, i.e. the mode switching for the first parametric amplifier can be set to zero, then it is straightforward to see that the requirement is met provided that $t_{earliest}(n+1)=t_{latest}(n)+T$, i.e. the earliest permissible time for the n+1th parametric amplifier to start is T time units after the last time that the nth parametric amplifier could have started. This gives:

$$t_{earliest}(n)=(1-Tol) \cdot t_{nominal}(n)$$

$$t_{latest}(n)=(1+Tol) \cdot t_{nominal}(n)$$

From these it is straightforward to see how the sequence of nominal times can be produced according to a trivial recursion:

$$t_{earliest}(1)=T_{initial}$$

$$t_{nominal}(1)=t_{earliest}(1)/(1-Tol)$$

$$t_{latest}(1)=t_{nominal}(1) \cdot (1+Tol)$$

$$t_{earliest}(2)=t_{latest}(1)+T$$

$$t_{nominal}(2)=t_{earliest}(2)/(1-Tol)$$

$t_{latest}(2) = t_{nominal}(2) \cdot (1+Tol)$ $t_{earliest}(3) = t_{latest}(2) + T$ and so on.

This algorithm guarantees that the requirement for minimum separation of mode switching times is always met. Given the distribution of components within their tolerance and the overall statistics, it may be preferable to use a less stringent requirement. For example the tolerance value used in the above algorithm could be set slightly lower than the actually specified tolerance. This would create a yield that was less than 100%, but that might nevertheless be acceptable, whilst providing lower overall measurement times.

The calibration signal shown in FIG. 3 is a simple carrier wave. If the frequency of this falls within the bandwidth of the MR signal then the calibration signal may excite the patient, albeit at low level. Moreover, free inductions decays from the patient will interfere with reception of the calibration signal. To address these issues, the frequency of the calibration signal carrier is shifted outside of the MR signal bandwidth, whilst keeping its frequency relatively close in order to ensure that the measured radio propagation paths are as representative of the in-band paths as possible.

Furthermore, the calibration signal may be composed of two carrier signals that are substantially continuous for the period of calibration. The carrier signal frequencies are arranged such that they are disposed symmetrically about the nominal center of the MR signal bandwidth, but outside of the MR signal bandwidth. This has the advantage that the measured path gains are the effective means of path gains measured above and below the nominal center of the MR signal bandwidth. Compared with a single carrier outside the MR signal bandwidth, this approach also has the benefit that the calibration signal can be received in a greater effective bandwidth, allowing smaller gaps between parametric amplifier mode switching times. Preferably the two carrier signals are generated by multiplying the output of an oscillator 67 that operates at the nominal center of the MR signal bandwidth by the output of a second oscillator 68 that operates at a frequency equal to one half of the desired frequency separation between the two carrier signal frequencies. Such a system is indicated in FIG. 9.

Figure 9:
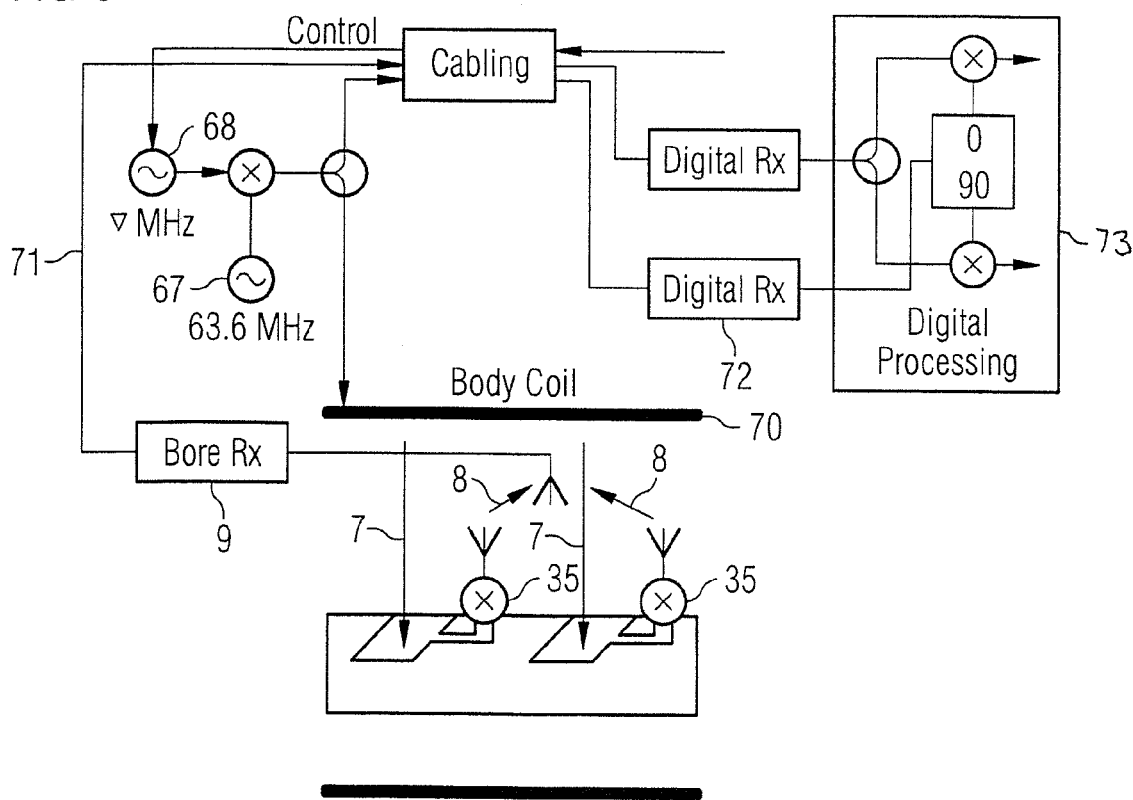
FIG. 9 is a partial illustration of a motion compensation circuit according to the present invention.

FIG. 9 is based on a 1.5 Tesla MRI scanner with a resultant Larmor frequency of 63.6 MHz. The nominal center of the MR bandwidth is therefore also equal to 63.6 MHz in this example. The oscillator 38 that provides the two calibration signal carriers is set at a frequency of $\nabla$ MHz, where $\nabla$ is typically 0.15. We refer to this hereinafter as the offset oscillator 68. In order for the calibration signal to be repeatable from one measurement to the next, the phase of the offset oscillator must be reset to the same value at the same point within the calibration sequence for every measurement cycle.

Preferably, when performing the calibration, each bore receiver output 71 is received in a bandwidth, defined by a digital filter 72, which is symmetrically disposed about the nominal center of the MR signal bandwidth. This receive bandwidth encompasses the MR signal bandwidth so does not provide rejection of any interference from the MR signals. The digital filters 72 are coupled to a digital processing stage 73. Preferably the received calibration signals are used to estimate the path gain by means of a bank of Wiener estimators, one for each parametric amplifier mode switching time. A Wiener estimator is the optimum estimator for a signal or parameter, taking account of known statistics of noise and interference. Thus, the Wiener estimator effectively forms a notch filter over the MR signal bandwidth. Assuming that the path gains are uncorrelated, the optimum set of estimator is given by $L = R^H(RR^H + C)^{-1}$ where R is a $n_{samp} \times (n_{patient}+1)$ matrix of responses to parametric amplifier mode changes and where $n_{samp}$ is the number of time domain samples and $n_{patient}$ is the number of parametric amplifiers. The superscript 'H' denotes Hermitian transpose. C is the auto-correlation of the noise or interference in the receiver. This is the sum of the noise correlation matrix derived from the time auto-correlation of noise introduced by the receiver filter and a correlation matrix obtained by treating the MR signal as band limited noise. The reason that the rows of matrix R have length ($n_{patient}+1$), rather than just $n_{patient}$ is because an additional column has been introduced to correspond to the initial activation of the calibration signal. The inclusion of this column removes the effect of the initial activation from the calibration. In fact, because there is no need to estimate the response of the parametric amplifiers in abnormal mode to the initial activation, this column can be removed from the R in the outer part of the evaluation of the Wiener estimators. Thus, the coefficients of the Wiener estimators can be determined as $L = R'^H(RR^H + C)^{-1}$, where R' is the matrix R with the column corresponding to the initial activation response removed.

In the present invention, an estimate of a plurality of path gains over paths from a plurality of local coils to a receiver is derived from a received signal and a signal response function corresponding to each of the local coils. The estimate may be derived for multiple receivers. The signal response function corresponding to a local coil comprises a time sampled convolution of the activation function including a time offset corresponding to an activation time of the local coil corresponding to that local coil, a bandlimiting function associated with a radio channel; and a complex baseband representation of a signal calibration waveform and can be arranged as rows or columns of a constructor matrix. Estimates of path gains from a local coil to a receiver are formed by multiplying a vector of the time sampled signal received from the receiver by a pseudo-inverse of a constructor matrix.

In one embodiment, a single carrier calibration signal centered on the MR signal bandwidth is transmitted prior to an MR imaging sequence for determining the signal arrival delays. This is advantageous because the single carrier transmission more effectively resolves the signals at different mode switching times, making full use of the available bandwidth. It is possible, because at this point in time there are no MR signals either to cause or suffer interference.

In the initial calibration phase, the period of calibration signal may be extended longer than is applied during the normal scan calibration measurements in order to allow time for the responses to all the parametric amplifier mode changes substantially to stabilize before the response to the removal of the calibration signal begins. Measurement of the responses of parametric amplifiers to the removal of the calibration is then used to obtain a prototype measurement of the overall impulse response, for use in the analysis. Time offset versions of this prototype response are used to construct the columns of R.

During the scan the preferred mode of operation is to introduce the trigger of the parametric amplifiers into abnormal mode and activate the calibration signal, once following every MR activation pulse. The preferred time to do this would be immediately following any detuning of the local coils following the activation pulse and prior to receipt of the first echo.

Signals received from the outputs of the bore receivers are processed using the outputs of the Wiener filter estimators to substantially remove the effects of motion. This can be done in any of a number of different ways, specifically, invert the measured matrix of path gains from local coils to bore receiver outputs and multiply the matrix of signals in time by this matrix. This reduces the number of signals that must be processed from the number of bore receiver outputs, down to the number of local coils.

A more transparent compensation can be obtained by taking the output of the above step and multiplying it by a 'representative' measured matrix of path gains. This leaves the same number of signals as previously but with the effects of motion removed. The representative matrix could, for example, be the result of the first path gain matrix measurement. It may be desirable to average over several such measurements in order to reduce the measurement noise in producing the representative matrix.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method of calibration of a magnetic resonance imaging system, the system comprising a bore, a body coil mounted in the bore, a patient mat, a plurality of local coils mounted in the patient mat, an upconversion stage comprising a plurality of upconverters, and a processing stage, said method comprising the steps of:
generating a calibration signal in the body coil; receiving the calibration signal at the local coils;
upconverting the signal from the local coils in the upconversion stage;
transmitting the upconverted signal to the processing stage;
synchronously downconverting the signal in the processing stage using the calibration signal generated in the body coil; and
processing the downconverted signal to generate an overall path complex gain.

2. A method according to claim 1, comprising employing a parametric amplifier as said upconverter.

3. A method according to claim 1, comprising employing a mixer in said upconverter.

4. A method according to claim 2, comprising employing a low noise amplifier in said upconverter.

5. A method according to claim 1, comprising separately activating each of the plurality of upconverters to produce a signal from each of the upconverters that is individually resolvable, to generate individual upconverter path gains in the processing stage.

6. A method according to claim 5, comprising activating the upconverters by an activation waveform, in accordance with an activation function.

7. A method according to claim 6, comprising activating the upconverters by triggering a change of mode of the upconverters from an abnormal mode to a normal mode.

8. A method according to claim 1, comprising terminating generation of the calibration signal after activation of the last of the plurality of upconverters.

9. A method according to claim 1, comprising deriving an estimate of a plurality of path gains over paths from a plurality of local coils to a receiver from a received signal and a signal response function corresponding to each of the local coils.

10. A method according to claim 9, comprising arranging signal response functions as rows or columns of a matrix.

11. A method according to claim 9, comprising employing, as the signal response function corresponding to a local coil, a time sampled convolution of the activation function including a time offset corresponding to an activation time of the local coil corresponding to that local coil, a bandlimiting function associated with a radio channel; and a complex baseband representation of a signal calibration waveform.

12. A method according to claim 9, comprising deriving an estimate for each of a plurality of receivers.

13. A method according to claim 9, comprising forming estimates of path gains from a local coil to a receiver by multiplying a vector of the time sampled signal received from the receiver by a pseudo-inverse of a constructor matrix.

14. A method according to claim 8, comprising applying the calibration signal for a time period, after all upconverters have changed mode, sufficient to allow behavior of the upconverters in normal mode to stabilize before removing the calibration signal.

15. A method according to claim 14, comprising measuring a composite response of the upconverters to removal of the calibration signal.

16. A method according to claim 6, comprising employing a simple delay pulse as the activation waveform.

17. A method according to claim 1, comprising separately activating each of the plurality of upconverters in a sequence, to provide a signal from each of the upconverters that is individually resolvable, to generate individual upconverter path gains in the processing stage.

18. A method according to claim 17, wherein each upconverter is self starting and activated independently of the activation of any other.

19. A method according to claim 1, comprising separately activating each of the plurality of upconverters to produce a signal from each of the upconverters that is individually resolvable, to generate individual upconverter path gains in the processing stage, and comprising in the separate activation, within a tolerance of operation of components in the upconverter stage, maintaining a minimum time gap between activation of each succeeding upconverter.

20. A method according to claim 1, comprising separately activating each of the plurality of upconverters to produce a signal from each of the upconverters that is individually resolvable, to generate individual upconverter path gains in the processing stage, and comprising adding a partial geometric growth element to an assigned time of activation to provide a separation greater than or equal to the reciprocal of the receiving bandwidth between switching times.

21. A method according to claim 1, comprising measuring an activation time of each upconverter.

22. A method according to claim 1, comprising separately activating each of the plurality of upconverters to produce a signal from each of the upconverters that is individually resolvable, to generate individual upconverter path gains in the processing stage, and comprising implementing separate activation by one of a PIN switch, a varactor diode bias, or a low noise amplifier output switch.

23. A method according to claim 1, comprising configuring the calibration signal as a single carrier outside the magnetic resonance signal bandwidth.

24. A method according to claim 1, comprising transmitting a single carrier calibration signal centered on the magnetic resonance signal bandwidth prior to a magnetic resonance imaging sequence to determine signal arrival delays.

25. A method according to claim 1, comprising configuring the calibration signal as a pair of carriers whose frequencies are disposed symmetrically about the magnetic resonance signal frequency band.

26. A method according to claim 25, comprising employing, as the pair of carrier signals an output of a first oscillator operating at a nominal center of the magnetic resonance signal bandwidth multiplied by an output of a second oscillator at a frequency of one half of the desired separation in frequency of the two carriers.

27. A method according to claim 26, comprising resetting a phase of the first oscillator to a same value at the same point in the calibration sequence for every measurement cycle.

28. A method according to claim 1, wherein the system comprises a plurality of patient mats, and comprising activating upconverters of each patient mat with non-overlapping activation delays.

29. A method according to claim 28, comprising interleaving the activation delays for each mat.

30. A method according to claim 28, comprising activating upconverters within each of the mats limited by a field of view.

31. A method according to claim 30, comprising measuring the actual upconverter activation delay for upconverters within the field of view.

32. A method according to claim 1, comprising applying super-resolution based on an incremental multi-parameter algorithm.

33. A motion compensation circuit for a magnetic resonance imaging system, the system comprising a bore, a body coil mounted in the bore, a patient mat, a plurality of local coils mounted in the patient mat, an upconversion stage comprising a plurality of upconverters, and a processing stage, the motion compensation circuit comprising:

a calibration signal generator that generates a calibration signal in the body coil, receives the calibration signal at the local coils, upconverts the signal from the local coils in the upconversion stage, transmits the upconverted signal to the processing stage, synchronously downconverts the signal in the processing stage using the calibration signal generated in the body coil, and processes the downconverted signal to generate an overall path complex gain.

34. A circuit according to claim 33, comprising a first oscillator at the nominal center frequency of the magnetic resonance signal bandwidth and a second oscillator at a frequency of half the desired frequency separation between two calibration signal carriers.

35. A circuit according to claim 33, comprising a Wiener estimator in the processing stage for each upconverter.

36. A circuit according to claim 33, wherein the system comprises a plurality of patient mats and wherein the circuit comprises multiple upconverters respectively in said mats.

* * * * *